United States Patent [19]
Nordeng

[11] Patent Number: 5,663,680
[45] Date of Patent: Sep. 2, 1997

[54] CHOPPER STABILIZED AMPLIFIER HAVING AN ADDITIONAL DIFFERENTIAL AMPLIFIER STAGE FOR IMPROVED NOISE REDUCTION

[76] Inventor: Arnold E. Nordeng, 4311 S. 4th Ave., Everett, Wash. 98203

[21] Appl. No.: 627,531

[22] Filed: Apr. 4, 1996

[51] Int. Cl.$^6$ ................................................. H03F 1/14
[52] U.S. Cl. ................................................. 330/9; 330/51
[58] Field of Search .......................... 330/9, 51, 69; 327/124

[56] References Cited

U.S. PATENT DOCUMENTS

| | | | |
|---|---|---|---|
| 4,931,745 | 6/1990 | Goff et al. | 330/9 |
| 4,933,642 | 6/1990 | Lee | 330/9 |
| 5,047,727 | 9/1991 | Theus | 330/9 |
| 5,486,788 | 1/1996 | Schlager et al. | 330/9 |

OTHER PUBLICATIONS

"A Versatile Building Block: The CMOS Differential Difference Amplifier," IEEE Journal of Solid-State Circuits, vol. 2, Apr. 1987, pp. 287–294.

"Design of MOS VLSI Circuits for Telecommunications," Tsividis and Antognetti, Prentice-Hall, 1985, pp. 159–169.

Primary Examiner—Steven J. Mottola
Attorney, Agent, or Firm—George T. Noe

[57] ABSTRACT

A chopper-stabilized amplifier having an additional differential amplifier stage for improved noise reduction. A main amplifier provides a fast AC path, while a nulling amplifier is used to zero out input offset voltages of both the main amplifier and itself. An additional differential amplifier stage precharges the nulling amplifier within an offset compensating loop to a predetermined voltage such that when the nulling amplifier is switched into the main amplifier's loop, it contributes no unwanted noise at the output of the main amplifier. An additional pair of switches activated by an additional phase of the chopper clock insert the precharge differential amplifier into the circuit at the appropriate time.

1 Claim, 2 Drawing Sheets

CHOPPER STABILIZED AMPLIFIER HAVING AN ADDITIONAL DIFFERENTIAL AMPLIFIER STAGE FOR IMPROVED NOISE REDUCTION

BACKGROUND OF THE INVENTION

This invention relates generally to chopper stabilized amplifiers, and in particular to a chopper stabilized amplifier having an additional differential amplifier stage for improved noise reduction.

Complementary metal-oxide-semiconductor (CMOS) technology is popular in forming integrated circuit field-effect transistor (FET) operational amplifiers. A problem in creating differential amplifiers using CMOS technology, however, is keeping the input offset voltage both small, e.g., less than one hundred microvolts, and very stable over time and temperature. The offset voltage of CMOS amplifiers is caused by systematic bias errors between stages and mismatches between identical MOS devices.

Chopper stabilized amplifiers are well known in the electronics field, and have been used for many years for designing precision DC amplifiers. Traditionally, they achieve a high degree of DC stability by "chopping" or modulating the input DC signal with a high-frequency clock to produce an AC signal, amplifying the modulated AC signal as well as any amplifier offset signal, and then synchronously demodulating the AC signal back into a DC signal. Any input offset signal remains modulated at the chopping frequency, and is filtered.

One of the drawbacks to the foregoing approach is that the amplifier is essentially a sampled data system, the bandwidth of which is limited to one-half the Nyquist sampling frequency (the chopping frequency). To overcome this drawback and provide wide bandwidth amplifying characteristics, a fast AC-coupled operational amplifier was added to the chopper-stabilized amplifier to provide a composite amplifier structure. The chopper-stabilized amplifier biases the fast operational amplifier's non-inverting input to force the summing point to zero. The high-frequency roll-off of the chopper-stabilized amplifier must coincide with the low-frequency cutoff the fast AC-coupled amplifier in order for the amplifier to have smooth gain and phase characteristics.

Conventional CMOS chopper-stabilized operational amplifiers as described above are commercially available from a number of vendors. The fast AC-coupled amplifier is characterized as the main amplifier, and chopper-stabilized amplifier is characterized as the nulling amplifier. The main amplifier is connected full time from the input to the output, while the nulling amplifier operates under control of a chopper clock to alternately null itself and the main amplifier. It is in the switching of the output of the nulling amplifier to main amplifier's non-inverting input that a slight mismatch in voltages contributes unwanted noise into the output of the main amplifier.

SUMMARY OF THE INVENTION

In accordance with the present invention, the foregoing problem of unwanted noise is solved in an improved chopper-stabilized amplifier. An additional differential amplifier stage precharges the nulling amplifier within an offset compensating loop to a predetermined voltage such that when the nulling amplifier is switched into the main amplifier's loop, it contributes no unwanted noise at the output of the main amplifier. An additional pair of switches activated by an additional phase of the chopper clock insert the precharge differential amplifier into the circuit at the appropriate time.

It is therefore one object of the present invention to provide an improved chopper-stabilized amplifier with improved low noise performance.

It is another object of the present invention to provide a chopper-stabilized amplifier having main and nulling amplifiers with an additional amplifier to precharge the output of the nulling amplifier such that when the nulling amplifier is switched into the input of the main amplifier, it contributes no unwanted noise at the output of the main amplifier.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
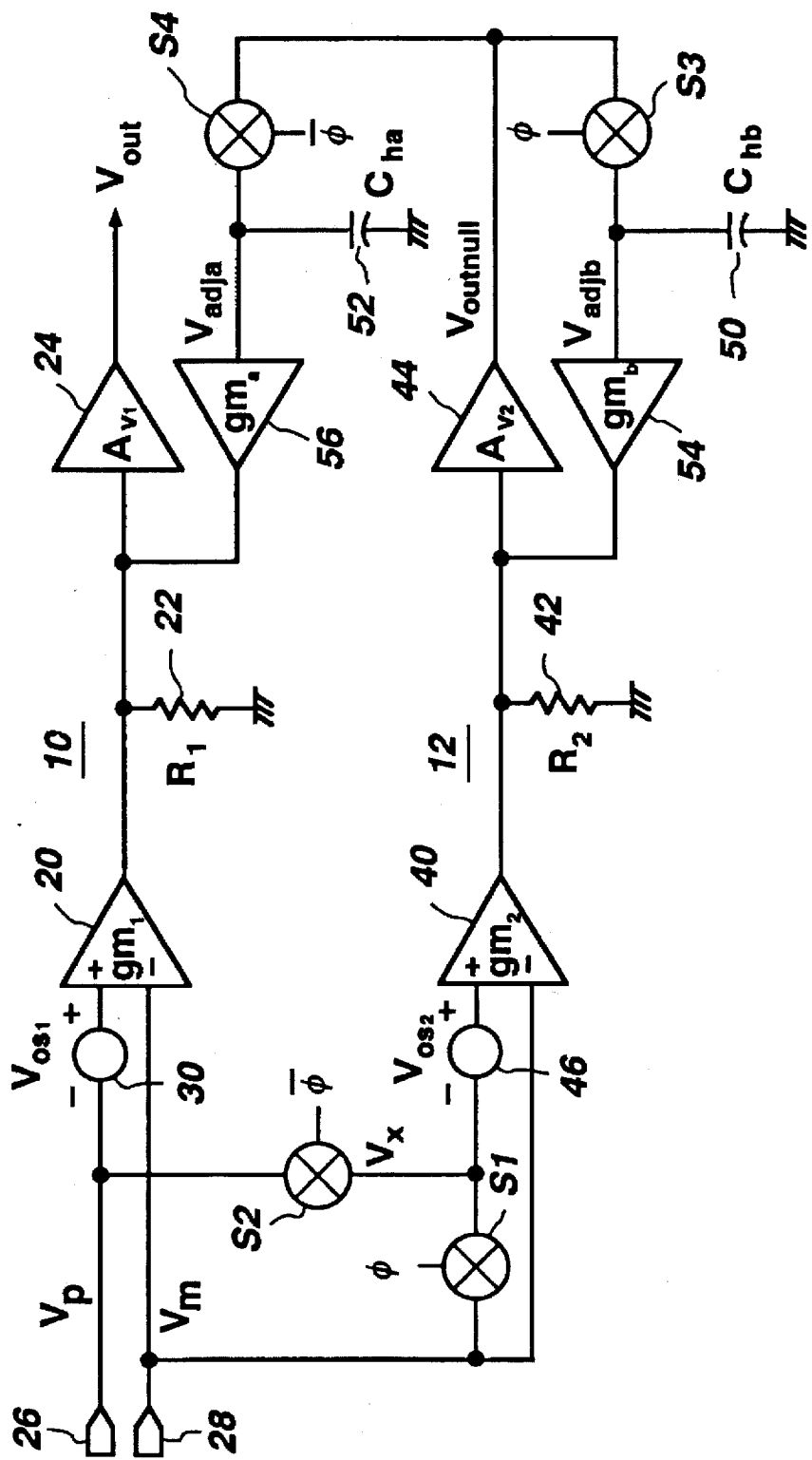
FIG. 1 is a schematic diagram of a prior art chopper-stabilized amplifier.

A full understanding of the present invention can best be attained following an understanding of the operation of conventional chopper-stabilized amplifiers. Referring to FIG. 1 of the drawings, there is shown a mathematic model of a conventional chopper-stabilized amplifier comprising a main amplifier 10 and a nulling amplifier 12.

Main amplifier 10 provides a fast AC path, and includes an input differential amplifier 20 having a transconductance of $gm_1$, the output of which is coupled to a load resistor 22 having a resistance value $R_1$ and to an output drive amplifier 24, which has a voltage gain of $A_{V1}$. The inverting and non-inverting inputs of differential amplifier 20 are connected to a pair of input terminals 26 and 28. Offset voltage for input differential amplifier 20 is modeled by a voltage generator 30 having a value $V_{OS1}$.

Nulling amplifier 12 provides a DC or low-frequency path, and includes a differential amplifier 40 having a transconductance of $gm_2$, the output of which is coupled to a load resistor 42 having a resistance value $R_2$ and to an output drive amplifier 44, which has a voltage gain of $A_{V2}$. Switches S1 and S2, which may suitably be FET switches, alternately connect the inverting and non-inverting inputs of differential amplifier 40 together and then to input terminals 26 and 28 at a rate determined by chopper clock $\phi$. Offset voltage for input differential amplifier 40 is modeled by a voltage generator 46 having a value $V_{OS2}$. The output of amplifier 44 is alternately coupled through switches S3 and S4 to sample-hold capacitors 50 and 52, respectively, where respective voltages $V_{abjb}$ and $V_{adja}$ are stored, and to the inputs of buffer amplifiers 54 and 56, which have transconductance values of $gm_b$ and $gm_a$, respectively. The outputs of buffer amplifiers 54 and 56 are coupled to the inputs of driver amplifiers 44 and 24, respectively.

The general equation for nulling amplifier 12 is $$V_{outnull} = A_{V2} R_2 [gm_2 (V_X - V_M + V_{OS2}) + gm_b V_{abjb}] \tag{1}$$

During the self-nulling cycle, the inputs amplifier 40 are connected together through switch S1 and the output of amplifier 44 is connected through switch S3 to the input of buffer amplifier 54 (and both switches S2 and S4 are off), resulting in the nulling amplifier hulling out the voltage offset $V_{OS2}$ of its own amplifier. In this condition, $V_X=V_M$, and $V_{outnull}=V_{abjb}$. Observing that $gm_b R_2 A_{V2>>}1$, it can be determined from Equation (1) that $V_{outnull} \cong -(gm_2/gm_b) V_{OS2}$. Accordingly, it can be discerned that the offset voltage of the nulling amplifier 12 during the self-nulling cycle is scaled by the ratio of the transconductance of the input stage to the transconductance of the feedback stage and is stored on capacitor 50. Thus, $$V_{adjb} \cong -(gm_2/gm_b) V_{OS2}. \quad (2)$$

During the main amplifier nulling cycle, switch S1 is disconnected or off, and differential amplifier 40 is connected to input terminals 26 and 28 through switch S2, which is on. Switch S3 is off and switch S4 is on, disconnecting the output of amplifier 44 from the input of buffer amplifier 54 and connecting it to the input of buffer amplifier 56. Assuming that the self-nulling cycle has taken place, and the previous output $V_{outnull}$ from amplifier 44 has been stored on capacitor 50 as $V_{adjb}$, it can be determined by substituting Equation (2) into Equation (1) that $V_{outnull} = A_{V2}R_2gm_2(V_P-V_M)$. Note that during the main amplifier nulling cycle, the $V_{OS2}$ term has been subtracted out, resulting in an amplifier with no offset voltage. The new $V_{outnull}$ value from amplifier 44 is stored on capacitor 52. Thus, $$V_{adja}=V_{outnull}=A_{V2}R_2gm_2(V_P-V_M). \quad (3)$$

The general equation for the main amplifier 10 is $$V_{out}=A_{V1}R_1[gm_1(V_P-V_M+V_{OS1})+gm_a V_{adja}]. \quad (4)$$

Assuming that the self-nulling cycle has zeroed the offset of the nulling amplifier as described hereinabove, it can be demonstrated that by substituting Equation (3) into Equation (4) and simplifying yields the output of the main amplifier 10 as $$V_{out}=gm_a gm_2 R_1 R_2 A_{V1} A_{V2}(V_P-V_M). \quad (5)$$

Note that Equation (5) has no offset voltage terms. In examining the contribution of the voltage stored on capacitor 52 to the output voltage, consider the $V_{adja}$ term in Equation (4), which is the general equation for the main amplifier 10. From inspection, the voltage stored on capacitor 52 which will ideally trim out the offset voltage for the main amplifier is $$V_{adja}=V_{outnull} \cong -(gm_1/gm_a) V_{OS2}. \quad (6)$$

In comparing Equation (6) with Equation (2), one would expect that the voltages stored on capacitors 50 and 52 would be equal; however, $V_{adja} \neq V_{adjb}$ because of mismatches in MOS devices, as well as temperature differences between amplifiers. The voltage $V_{outnull}$ at the output of amplifier 44 must slew between these voltages to alternately null out the respective offsets of the nulling amplifier 12 and the main amplifier 10. However, because of the limited slew rate of $V_{outnull}$ compared with the switching speed of switch S4 and the further limitation in the slew rate of the operational amplifier itself, the finite slewing of $V_{outnull}$ toward $V_{adja}$ results in unwanted noise at the output of the main amplifier, multiplied by the cascaded stages $gm_a A_{V1}$.

Figures 2, 3:
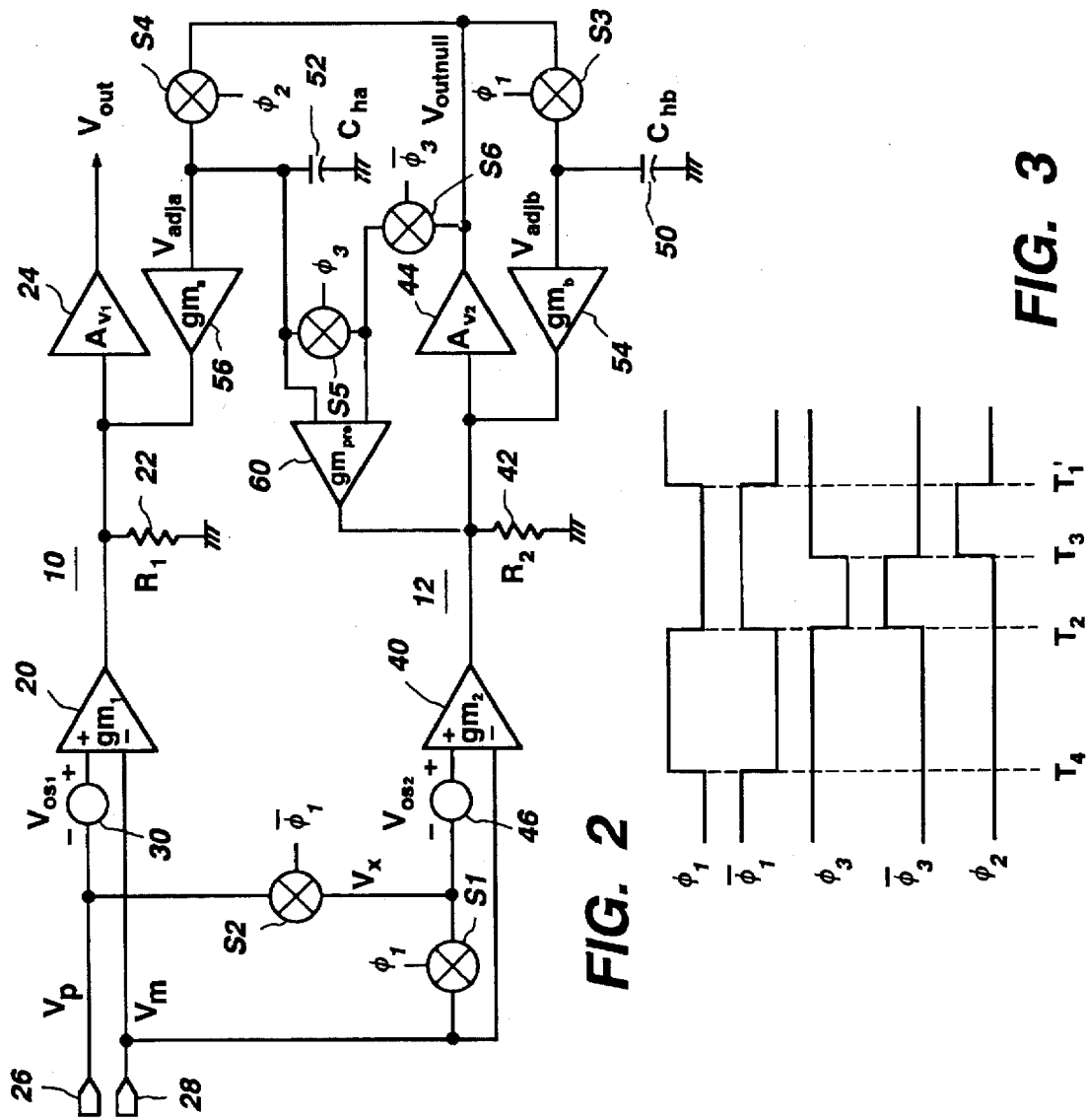
FIG. 2 is a schematic diagram of an improved chopper-stabilized amplifier in accordance with the present invention.
FIG. 3 is a ladder diagram of waveforms produced by a three-phase chopper clock.

FIG. 2 is a schematic diagram of an improved chopper-stabilized amplifier in accordance with the present invention, wherein foregoing problem is solved. For simplicity of discussion, like elements have like reference numerals, and except where noted, operation is the same.

A precharge differential amplifier 60 has a non-inverting input connected to the junction of capacitor 52 and the input of buffer amplifier 56, and an inverting input coupled through a switch S6 to the output of amplifier 44. An additional switch S5 is coupled across the non-inverting and inverting inputs of differential amplifier 60. The output of differential amplifier 60 is connected to the input of amplifier 44.

Referring to FIG. 3, which is a ladder diagram of waveforms produced by a threephase chopper clock, it can be seen from inspection that when the clock voltages are positive, various switches are on, and when the clock voltages are negative, various switches are off. At time $T_1$ chopper clock phase $\phi_1$ is asserted, closing switch S1 and connecting the inputs of differential amplifier 40 together. At this time, switches S3 and S5 are on, connecting the output of amplifier 44 to the input of buffer amplifier 54, and the inputs of precharge differential amplifier 60 are connected together as well. This is the self-nulling cycle of nulling amplifier 12 as described hereinabove.

At time $T_2$, switches S3 and S5 are opened and switch S6 is closed, and the precharge differential amplifier becomes an operational amplifier with amplifier 44 functioning as the feedback element to cause the inverting input to balance the voltage on the non-inverting input. That is, the non-inverting input receives the voltage stored on capacitor 52, which is $V_{adja}$. A voltage is developed at the output of amplifier 60, which in turn raises the value $V_{outnull}$ through amplifier 44 until the two inputs of amplifier 60 are balanced, and $V_{outnull}=V_{adja}$.

At time $T_3$, switch S5 closes and switch S6 opens, disconnecting the precharge differential amplifier 60 from the output of amplifier 44. At the same time, switch S4 closes, connecting the output of amplifier 44 to the input of amplifier 56. Since $V_{outnull}$ is precharged to $V_{adja}$ before switch S4 is turned on (closed), no unwanted noise is coupled to the output of the main amplifier 10 via cascaded stages $gm_a A_{V1}$.

While I have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. A low-noise chopper-stabilized amplifier, comprising:

an input signal path;

a main amplifier including a first input differential amplifier coupled to said input signal path and a signal output stage, said signal output stage having a first offset voltage compensation circuit connected thereto;

a nulling amplifier including a second differential amplifier and a null voltage output stage, said null voltage output stage having a second offset voltage compensation circuit connected thereto, wherein said nulling amplifier alternates between first state in which the inputs of said second differential amplifier are connected together and the output of said null voltage output stage is applied to said second offset voltage compensation circuit and a second state in which the inputs of said second differential amplifier are coupled to said input signal path and the output of said null voltage output stage is applied to said first offset voltage compensation circuit; and a precharge differential amplifier having a first input coupled to said first offset voltage compensation circuit and a second input coupled to the output of said null voltage output stage, and further having an output couled to the input of said null voltage output stage, said precharge amplifier being activated between said first and second states to precharge the output of said null voltage output stage to a voltage stored in said first offset voltage compensation circuit.

* * * * *